United States Patent

[11] 3,634,780

[72] Inventors Berthold Bosch
Ulm,Soflingen;
Horst Pollmann, Ay,Iller, both of Germany
[21] Appl. No. 887,625
[22] Filed Dec. 23, 1969
[45] Patented Jan. 11, 1972
[73] Assignee Telefunken Patentverwertungsgesellschaft m.b.H.
Ulm on Danube, Germany
[32] Priority Dec. 24, 1968
[33] Germany
[31] P 18 16 922.7

[54] MAGNETICALLY FREQUENCY-TUNABLE SEMICONDUCTOR TRANSIT TIME OSCILLATOR
8 Claims, 3 Drawing Figs.

[52] U.S. Cl. .......... 331/107 G, 307/309, 317/234 V, 317/235 H, 331/177 R, 332/51, 332/52
[51] Int. Cl. .......... H03b 7/00
[50] Field of Search .......... 331/107 R, 107 G, 177 R; 307/309; 317/234 V, 235 H; 332/51, 52

[56] References Cited
UNITED STATES PATENTS
2,894,234 7/1959 Weiss et al. .......... 317/235 H
3,490,070 1/1970 Hini .......... 317/235 H
FOREIGN PATENTS
1,130,657 10/1968 Great Britain .......... 331/107 G
OTHER REFERENCES
Steele, " Magnetic Tuning of Gunn Effect Oscillators," RCA Technical Notes No. 663, Nov. 1965, pp. 1, 2.

*Primary Examiner*—Roy Lake
*Assistant Examiner*—Siegfried H. Grimm
*Attorney*—Spencer & Kaye

ABSTRACT: The frequency tunability of a semiconductor oscillator of the type wherein the frequency is dependent on the transit time of charge carriers in an electric field is improved by exposing the semiconductor device to a magnetic field which extends perpendicular to the normal direction of movement of the charge carriers by providing the semiconductor body with strip-shaped metal conductive paths which extend perpendicular to both the transverse component of the magnetic field and the electric field in order to short circuit any resulting Hall voltages. The frequency of the oscillation is varied by varying the magnitude of the transverse magnetic field.

Inventors.
Berthold Bosch
Horst Pollmann

BY Spencer & Kaye
ATTORNEYS.

MAGNETICALLY FREQUENCY-TUNABLE SEMICONDUCTOR TRANSIT TIME OSCILLATOR

BACKGROUND OF THE INVENTION

The present invention relates to a frequency-tunable semiconductor oscillator of the type comprising a monocrystalline semiconductor body of at least one suitably doped layer which is provided with two ohmic contacts to which is applied a voltage source of sufficient potential to produce an electric field between the contacts of sufficient intensity to trigger an oscillation in the semiconductor body, the frequency of the oscillations being a function of the transit time of the charge carriers through the semiconductor body or portion thereof.

Various types of semiconductor oscillators which operate on the above-mentioned principle are known in the art. Two such examples of this type of semiconductor oscillator for operation in the microwave range are the so-called Gunn Oscillator and the so-called avalanche transit time oscillators which utilize multilayered semiconductor devices with avalanche being produced across a PN-junction therein. While the basic theory of operation of these oscillator devices is dissimilar, they both possess the property that the oscillator frequency is related to the transit time of the charge carriers through the entire semiconductor body or portion thereof. The transit time of the charge carriers in such devices is, among other parameters, related to the intensity of the applied electric field, and to the physical length of the path which the charge carriers must travel through the semiconductor device. The physical length of the path which the charge carriers follow is in general determined by the physical dimensions of the device. If the physical length of the path which the charge carriers must travel could be increased or varied in a completed device, then obviously the transit time, and hence the frequency of oscillations, could also be varied in accordance with the change in travel path length.

If a semiconductor body to which is applied an electric field is in addition simultaneously subjected to a magnetic field having a component perpendicular to the electric field, the charge carriers, which normally move within the semiconductor body parallel to the direction of the electric field, will be deflected from their normal path depending on the relative orientation of the magnetic field and the velocity or electric field vector. For example, as is most normally the case in practice, if the semiconductor body is a parallelepiped with plane parallel ohmic contacts for the application of the potential necessary to create the electric field, the additionally applied magnetic field component which is transverse to the direction of the movement of the charge carriers, i.e., the direction of the electric field, causes the charge carriers to be deflected in the direction of the contact-free longitudinal sides of the semiconductor body resulting in an enrichment in the charges produced on that side of the semiconductor body and a reduction of the charge on the opposite side. This resulting change in the charge carrier path produces a Hall voltage which, together with the transverse component of the magnetic field, again deflects the charge carriers to an extent sufficient to cause the original deflection to be substantially cancelled out. Accordingly, due to this counteracting Hall voltage, the change in the length or extension of the transit path of the charge carriers between the ohmic contacts, and thus the change in the frequency of oscillation, is so slight as to render this technique generally unusable for tuning the frequency of the oscillator.

SUMMARY OF THE INVENTION

It is accordingly an object of the present invention to increase the frequency tuning range of a semiconductor oscillator of the type described above by increasing the travel path of the charge carriers and hence the transit time and thus decreasing the frequency of oscillation.

The above and other objects are achieved according to the invention by providing a monocrystalline semiconductor body having at least one suitably doped layer with a pair of spaced ohmic contacts to which is connected a suitable DC potential for producing an electric field between the contacts of sufficient intensity to initiate an oscillation whose frequency is a function of the transit time of the charge carriers in the semiconductor body. Means are also provided for applying a magnetic field to the semiconductor body so that a component of the field is perpendicular to the direction of drift of the charge carriers due to the electric field. In order to short circuit the resulting Hall voltage formed by the crossed electric and magnetic fields, the semiconductor body is provided with at least one small strip-shaped metal conductor which is perpendicular to both the perpendicular component of the magnetic field and to the electric field.

The short circuiting of the Hall voltage allows the magnetic field to cause the charge carriers to follow a cycloidal rather than a linear path, thus substantially varying the length of the path of the charge carriers in accordance with the magnitude of the perpendicular component of the magnetic field, and thereby allowing the frequency to be varied over a substantial range.

DESCRIPTION OF THE PREFERRED EMBODIMENTS

Figure 1:
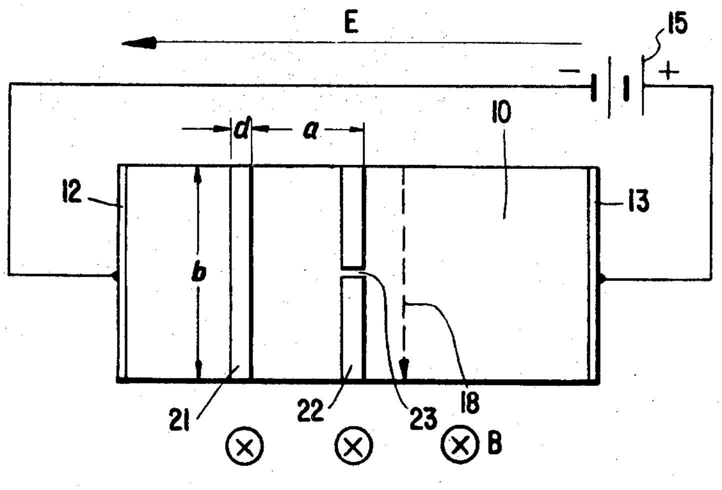
FIG. 1 is a plan view of one embodiment of a semiconductor oscillator according to the invention.
Figure 2:
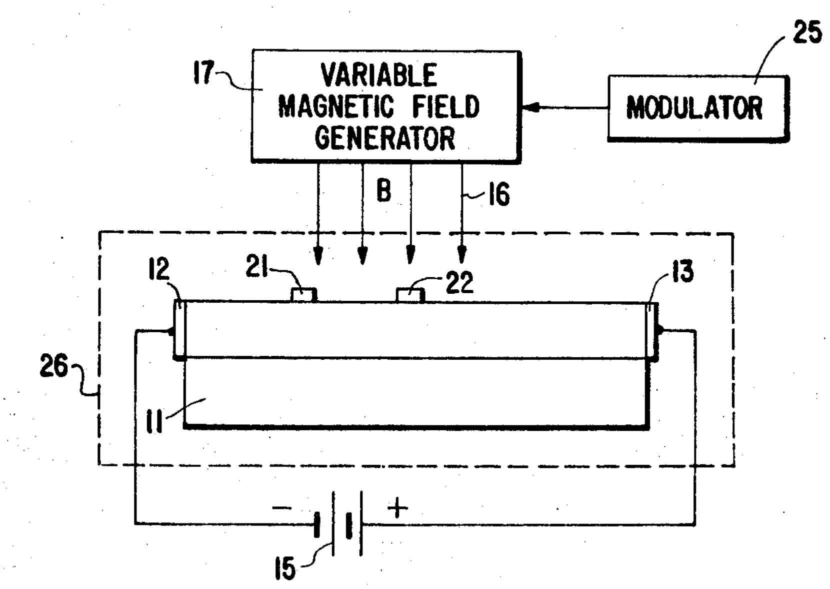
FIG. 2 is an elevational view of the embodiment of the invention shown in FIG. 1.

Referring now to FIGS. 1 and 2, there is shown an embodiment of the invention as applied to a Gunn-type oscillator. As shown in the Figures, a body or layer of semiconductor material 10, for example, of suitably doped gallium arsenide or indium phosphide, is applied to a carrier support 11 in a manner well known in the art, for example by means of epitaxial deposition. The semiconductor body 10 is provided with a pair of ohmic contacts 12 and 13 at two opposite ends. The ohmic contacts 12 and 13 are connected to a suitable source of DC voltage 15 for producing an electric field E within the semiconductor device of sufficient intensity to initiate oscillations. The charge carriers, i.e., electrons, within the semiconductor body will then travel from the cathode electrode 12 to the anode electrode 13 along a path parallel to the electric field lines. Also applied to the semiconductor body 10 is a magnetic field B, indicated in FIG. 1 by the encircled crosses, and in FIG. 2 by the arrows 16, which is generated by a magnetic field generator 17 which may be of any standard design known in the art. As indicated, the magnetic field is preferably applied perpendicular to the direction of drift of the charge carriers caused by the electric field, but at any rate at least has a component thereof which is perpendicular to the normal charge carrier travel path.

As indicated above, the perpendicular magnetic and electric fields tend to produce a Hall voltage in the semiconductor device which would tend to nullify the variation in linear travel path of the charge carriers due to the applied magnetic field. Accordingly, in order to short circuit or cancel out the Hall voltage, which is indicated in FIG. 1 by the dashed arrow 18, the semiconductor body 10 is provided with one or more suitably dimensioned and arranged meal striplike conductive paths. As illustrated, the semiconductor body 10 is provided with two metal striplike paths 21 and 22 which extend parallel to one another and are also parallel to the ohmic contacts 12 and 13. In order to avoid any adverse influence on the high field zone travelling through the semiconductor body 10 in a Gunn-type oscillator, and a distortion of the applied magnetic field, the width *d* of the metal strips 21 and 22 is selected to be as small as possible, i.e., of the order of a few micrometers.

Preferably as illustrated, the two metal striplike conductors 21 and 22 are selected to be of equal length and extend over the entire width of the semiconductor body 10, which is of the order of for example, about 100 microns. Additionally, the distance *a* between corresponding points on the two adjacent strips 21 and 22 in the direction of the propagation of the charge carriers is preferably selected to be at most equal to, and preferably less than, the length *b* of the strips. The reason for this relationship, i.e., $a>b$, is that the strips determine equipotential lines and if $a>b$ then it would be possible, in a first approximation, to produce a Hall voltage between the adjacent strips. Additionally, the number of such striplike conductors required is dependent on the distance between the ohmic contacts 12 and 13 and the above-mentioned distance or spacing relationship. Although an increase in the number of striplike conductors will initially increase the desired effect of allowing a greater frequency variation, care must be taken that the number of striplike conductors is not increased to such an extent that they substantially influence or even possibly destroy the domains.

It should be noted that although the striplike conductor 21 as illustrated is a continuous strip of uniform thickness, that other configurations are possible for various applications. For example, as illustrated, the striplike conductor 22 is provided with a discontinuity or slight interruption 23. Additionally, it is possible to arrange the adjacent striplike conductors so that they do not extend, as illustrated, over the entire width of the semiconductor body 10, but extend only partially across, alternating from one side to the other. Additionally, although, as illustrated, the striplike conductors 21 and 22 are preferably on the surface of the semiconductor body 10, if desired, they may also be placed or disposed within the interior of the semiconductor body 10. The use of discontinuity such as 23 is of particular importance when the strips are disposed within the semiconductor body 10, i.e., the active layer of the device, in order that the traveling domains not be destroyed.

As indicated above, the elimination of the Hall voltage by the strips 21, 22 permits the deflection of the charge carriers travel path by the magnetic field to cause sufficient increased transit time for the charge carriers to produce a usable variation in the frequency. In order to enable a variation in this transit time, the field generator 17, as indicated, is preferably one whose amplitude may be varied. Alternatively, or in addition to the variation of the magnitude of the magnetic field, the direction of the magnetic field may also be varied, whereby the magnitude of the magnetic field component perpendicular to the normal travel path of the charge carriers will also be varied. Additionally, since it is the magnitude of the magnetic field which affects the transit time, the frequency of oscillation may be also modulated by modulating the magnitude of the magnetic field, for example, by means of a modulator 25.

The effects of the magnetic field on the charge carrier path can be additionally increased by subjecting the semiconductor body 10 to a low-temperature environment during operation. The low temperatures can be provided, for example, by means of any conventional refrigeration technique or refrigeration unit indicated generally by the dashed rectangle 26 in FIG. 2. Preferably, the semiconductor oscillator is operated at a temperature range from −230° to −150° C. in order to produce the desired increased effect.

In this temperature range, e.g., the carrier mobility of GaAs reaches a maximum. Decreasing the temperature beyond the maximum causes the mobility to decrease, hence the velocity of the charge carriers will be reduced.

Preferably, the semiconductor body 10 is formed by the epitaxial application of the planar semiconductor layer onto the carrier 11. The conductive strips 21, 22 and the contacts 12 and 13 may then be applied in any known manner, for example, by means of vapor deposition to the surface of the semiconductor layer 10, suitable metals being gold or aluminum.

Though the invention has been illustrated with a relatively simple semiconductor Gunn Oscillator, it should be noted that for special applications the invention may be applied to modified forms of the semiconductor body. For example, the semiconductor body may consist of a plurality of different doped layers or one layer which is provided with zones of different doping.

Figure 3:
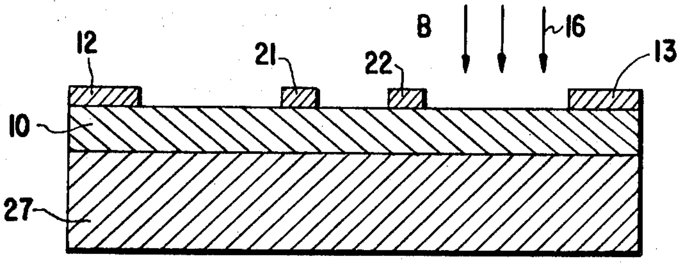
FIG. 3 is a schematic sectional view of a semiconductor oscillator according to the configuration shown in FIG. 1, having a plurality of doped layers, one of which is formed by epitaxial deposition.

FIG. 3 shows a planar-type Gunn oscillator, the active semiconductor layer 10 being deposited epitaxially on a semi-insulating substrate 27. The magnetic field 16 again is directed perpendicular to the direction of the drifting charge carrier and of the metal strips 21, 22, thus causing the Hall voltage to be cancelled out by the strips.

It will be understood that the above description of the present invention is susceptible to various modifications, changes and adaptations, and the same are intended to be comprehended within the meaning and range of equivalents of the appended claims.

We claim:

1. A frequency-tunable semiconductor oscillator comprising:

a. a monocyrstalline body of multivalley semiconductor material having the property of nucleating a high electric field region when a critical electrical bias field is exceeded and in which the high-field region will propagate through the semiconductor body under the influence of the bias field, said semiconductor body having at least one semiconductor layer which is sufficiently highly doped to allow the buildup of the high-field region:

b. a pair of spaced ohmic contacts formed on one surface of said semiconductor layer;

c. a source of DC voltage connected to said contacts for producing an electric field therebetween of sufficient intensity to exceed said critical field strength to nucleate and propagate said high electric field region along at least the portion of said semiconductor layer between said ohmic contacts thus causing the current through the semiconductor layer to oscillate at a frequency which is a function of the transit time of the high-field region consisting of charge carriers through said semiconductor layer;

d. means for applying a magnetic field to said semiconductor body, said magnetic field having a component thereof perpendicular to the direction of drift of the charge carriers caused by said electric field; and e. means for short circuiting the Hall voltage formed by the crossed electric and magnetic fields, said short circuiting means including a plurality of strip-shaped metal conductors contacting said semiconductor layer, said metal conductors being disposed parallel to one another and perpendicular to the said perpendicular component of the magnetic field and to the electric field, the distance in the direction of propagation of the charge carriers, between corresponding points of two of said strip-shaped metal conductors which are adjacent is at most equal to the length of said conductors, and wherein the width of said conductors is selected to be as small as possible.

2. The tunable oscillator defined in claim 1 wherein said strip-shaped metal conductors extend parallel to the said pair of ohmic contacts.

3. The tunable oscillator defined in claim 2, wherein said strip-shaped metal conductors contain a discontinuity.

4. The tunable oscillator defined in claim 1 wherein said semiconductor layer comprises an epitaxially formed planar layer.

5. The tunable oscillator defined in claim 4 wherein said striplike metal conductors are disposed on said one surface of said semiconductor layer.

6. The tunable oscillator defined in claim 5 wherein said striplike metal conductors are sufficiently long to extend across the entire width of said semiconductor layer.

7. A tunable frequency oscillator as defined in claim 1 wherein the magnitude of said perpendicular component of the magnetic field is variable.

8. The tunable frequency oscillator as defined in claim 1 including means for subjecting said semiconductor body to a low-temperature environment, whereby the transit time of said charge carriers can be further increased.

* * * * *